(12) United States Patent
Driessen

(10) Patent No.: US 9,557,393 B2
(45) Date of Patent: Jan. 31, 2017

(54) SWITCHED POWER CONVERTER

(71) Applicant: PRODRIVE B.V., Son (NL)

(72) Inventor: Antonius Wilhelmus Hendricus Johannes Driessen, Oss (NL)

(73) Assignee: Prodrive Technologies B. V., Em Son (NL)

( * ) Notice: Subject to any disclaimer, the term of this patent is extended or adjusted under 35 U.S.C. 154(b) by 200 days.

(21) Appl. No.: 14/515,028

(22) Filed: Oct. 15, 2014

(65) Prior Publication Data

US 2015/0109826 A1   Apr. 23, 2015

(30) Foreign Application Priority Data

Oct. 18, 2013 (NL) ..................................... 2011648

(51) Int. Cl.
*H02M 3/335* (2006.01)
*G01R 33/385* (2006.01)
(Continued)

(52) U.S. Cl.
CPC .......... *G01R 33/3852* (2013.01); *H02M 3/158* (2013.01); *H02M 7/49* (2013.01);
(Continued)

(58) Field of Classification Search
CPC ........ H02M 3/135; H02M 3/137; H02M 3/10; H02M 3/33523; H02M 3/3384; H02M 3/3372; H02M 3/3378; H02M 3/337; H02M 3/3376; H02M 3/33592; H02M 3/33569; H02M 1/12; H02M 1/4208; H02M 1/4225; H02M 1/14; H02M 1/15; H02M 1/143; H02M 1/4266; H02M 1/126; H02M 5/4585; H02M 5/458; H02M 5/4505; H02M 7/7575; H02M 7/537;H02M 7/003; H02M 7/5387; H02M 7/538; H02M 7/53871; H02M 7/5381; H02M 7/53835; H02M 7/53806; H02M 7/53846; H02M 7/06; H02M 7/5395; H02M 7/53873; H02M 7/53875; H02M 7/527; H02M 7/49

(Continued)

(56) References Cited

U.S. PATENT DOCUMENTS

| 6,005,788 A * | 12/1999 | Lipo | ....................... H02M 7/49 363/71 |
| 2003/0133317 A1* | 7/2003 | Norrga | .................. H02M 5/297 363/127 |

(Continued)

FOREIGN PATENT DOCUMENTS

| DE | 19812069 A1 | 9/1999 |
| DE | 102011000389 A1 | 8/2011 |

(Continued)

OTHER PUBLICATIONS

Lai R. et al., Analysis and Suppression of a Common Mode Resonance in the Cascaded H-Bridge Multilevel Inverter (2010), 4564-4568, New York.

*Primary Examiner* — Jessica Han
*Assistant Examiner* — Kevin H Sprenger
(74) *Attorney, Agent, or Firm* — The Webb Law Firm

(57) ABSTRACT

A switched power converter unit has a DC voltage source with a positive output connection and a negative output connection; a series connection of two switching units; a first output clamp, coupled to a common point of the two switching units of a first parallel branch via a first inductive element; a diode arranged to allow current flow from the first output clamp to the DC voltage source; a diode arranged to allow current flow from the DC voltage source to the first output clamp; a capacitor coupled parallel to diode D1, and/or a capacitor coupled parallel to diode D2; a second (Continued)

output clamp, coupled to a common point of the two switching units of a second parallel branch via a second inductive element; a diode arranged to allow current flow from the second output clamp to the DC voltage source; a diode arranged to allow current flow from the DC voltage source to the second output clamp; a capacitor coupled parallel to diode D3, and/or a capacitor coupled parallel to diode D4.

7 Claims, 3 Drawing Sheets

(51) Int. Cl.
*H02M 3/158* (2006.01)
*H03F 3/217* (2006.01)
*H02M 7/49* (2007.01)
*H03K 17/16* (2006.01)
*H02M 3/155* (2006.01)
*H02M 1/12* (2006.01)

(52) U.S. Cl.
CPC ......... *H03F 3/2178* (2013.01); *H03K 17/168* (2013.01); *H02M 1/126* (2013.01); *H02M 2003/1555* (2013.01)

(58) Field of Classification Search
USPC ........................... 363/24–26, 34, 37, 39–42, 44–48, 363/123–127, 131–134
See application file for complete search history.

(56) References Cited

U.S. PATENT DOCUMENTS

| | | |
|---|---|---|
| 2005/0275404 A1 | 12/2005 | Sabate et al. |
| 2006/0114623 A1 | 6/2006 | Domoto et al. |
| 2011/0187369 A1 | 8/2011 | Rivas Davila et al. |
| 2013/0155747 A1* | 6/2013 | Wang ................... H02M 7/487 363/132 |
| 2014/0284932 A1* | 9/2014 | Sharkh ................... F03D 9/002 290/54 |
| 2015/0130464 A1* | 5/2015 | Huisman ............... H02M 7/493 324/322 |

FOREIGN PATENT DOCUMENTS

| | | | | |
|---|---|---|---|---|
| EP | 2882090 | * | 6/2015 | .......... H02M 7/5387 |
| JP | 2006645 A | | 1/2006 | |
| WO | 2013099053 A1 | | 7/2013 | |

\* cited by examiner

SWITCHED POWER CONVERTER

CROSS-REFERENCE TO RELATED APPLICATION

This application claims priority to The Netherlands Patent Application No. 2011648 filed Oct. 18, 2013, the disclosure of which is hereby incorporated in its entirety by reference.

BACKGROUND OF THE INVENTION

Field of the Invention

The present invention relates to a switched power converter, and to power converter units to form such converter. In particular the invention relates to a power converter to be used for driving gradient coils in an MRI system.

Description of Related Art

Gradient coils in an MRI system require a high voltage and high current that must be controlled. This voltage is typically in the order of 2000V and above. The required peak current is in the order of 600 A and above.

To generate this high output voltage and high output current a so called stacked H-bridge multi-level power converter is typically used. Such converter may comprise a so called single H-bridge with electronically controlled switches. The bridge is connected to an isolated voltage source, which can be anything that behaves as a voltage source, for example an isolated DC/DC converter or a so called flying capacitor. The switches are controlled with a pulse width modulation scheme suitable for a H-bridge (for example unipolar or bipolar PWM). A stacked H-bridge consists of multiple H-bridges placed in series. The output connection terminals of the converter connect to the load. Such converter is known from the German Patent DE19812069, the Japanese Patent JP2006000645 or the US Patent US2011187369.

There is however a problem with the stacked H-bridges, due to the switching of the H-bridges there is a high dV/dt between each of the H-bridges. This high dV/dt combined with the parasitic capacitances between the separate bridges causes high leakage currents circulating and resonating in the converter. These currents have a negative effect on the converter output signal quality (output voltage and current unwanted high frequency spectral components) and EMC. This problem is addressed in the "Analysis and Suppression of a Common Mode Resonance in the Cascaded H-Bridge Multilevel Inverter (2010), Rixin Lai, Maja Harfman Todorovic and Juan Sabate" wherein a method is proposed to dampen these resonances using strategically placed common mode chokes. Such solution has the disadvantage that it cannot always be realised in practice, due to the requirements set to the control system and/or parasitic effects.

This invention therefore proposes a method to reduce the dV/dt and consequently reducing the circulating leakage currents that takes away the disadvantages of the prior art solutions.

SUMMARY OF THE INVENTION

The invention thereto proposes a switched power converter unit, comprising:
a DC voltage source with a positive output connection and a negative output connection;
two parallel branches between the positive and the negative output clamp of the DC voltage source, each branch comprising a series connection of two switching units;
a first output clamp,
coupled to a common point of the two switching units of the first parallel branch by means of a first inductive element;
coupled to the positive output clamp of the DC voltage source by diode, the diode arranged such to allow current flow from the first output clamp to the DC voltage source;
coupled to the negative output clamp of the DC voltage source by a diode arranged such to allow current flow from the DC voltage source to the first output clamp;
a capacitor coupled parallel to diode D1, and/or
a capacitor coupled parallel to diode D2;
a second output clamp,
coupled to a common point of the two switching units of the second parallel branch by means of a second inductive element;
coupled to the positive output clamp of the DC voltage source a diode arranged such to allow current flow from the second output clamp to the DC voltage source;
coupled to the negative output clamp (−) of the DC voltage source by a diode arranged such to allow current flow from the DC voltage source to the second output clamp;
a capacitor coupled parallel to diode D3, and/or
a capacitor coupled parallel to diode D4.

The arrangement of inductive elements, diodes and capacitors forms a clamped dV/dt filter. Adding this filter improves the output signal quality and EMC performance.

In an embodiment at least one switching unit is composed of multiple switching elements, such as one or more transistors, such as IGBTs in parallel. This way, larger currents can be dealt with.

In a preferred embodiment, a cut-off frequency (Fco), defined by Fco=1/(2*pi*sqrt (L1*(C1$a$+C2$a$))), is beyond the switching frequency of the first parallel branch.

Likewise, preferably a cut-off frequency (Fco), defined by Fco=1/(2*pi*sqrt (L1*(C1$b$+C2$b$))), is beyond the switching frequency of the second parallel branch.

A resistive element may be placed in series with at least one of the diodes, for smoothening the switching of the diodes.

The invention further relates to a switched power converter, comprising a plurality of switched power converter units according to any of the preceding claims, switched with their respective output clamps in series.

Preferably, in such switched power converter, a load is coupled to the first output clamp of the first switched power converter units of the plurality of switched power converter units by means of a first filter inductance, and wherein said load is coupled to the second output clamp of the nth switched power converter units of the plurality of switched power converter units by means of a second filter inductance and wherein a filter capacitance is coupled in parallel to said load.

BRIEF DESCRIPTION OF THE DRAWINGS

The invention will now be elucidated into more detail with reference to the following figures. Herein.

DESCRIPTION OF THE INVENTION

Figure 1:
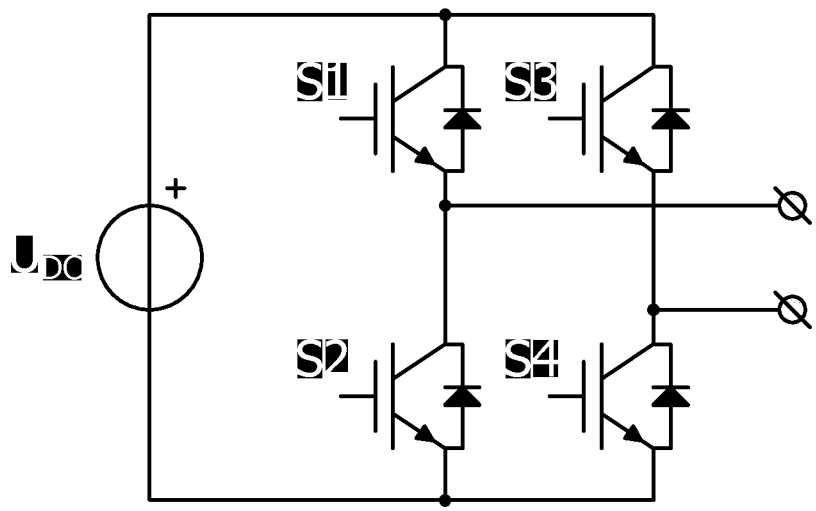
FIG. 1 shows a single H-bridge with IGBT switches according to the state of the art.
Figure 2:
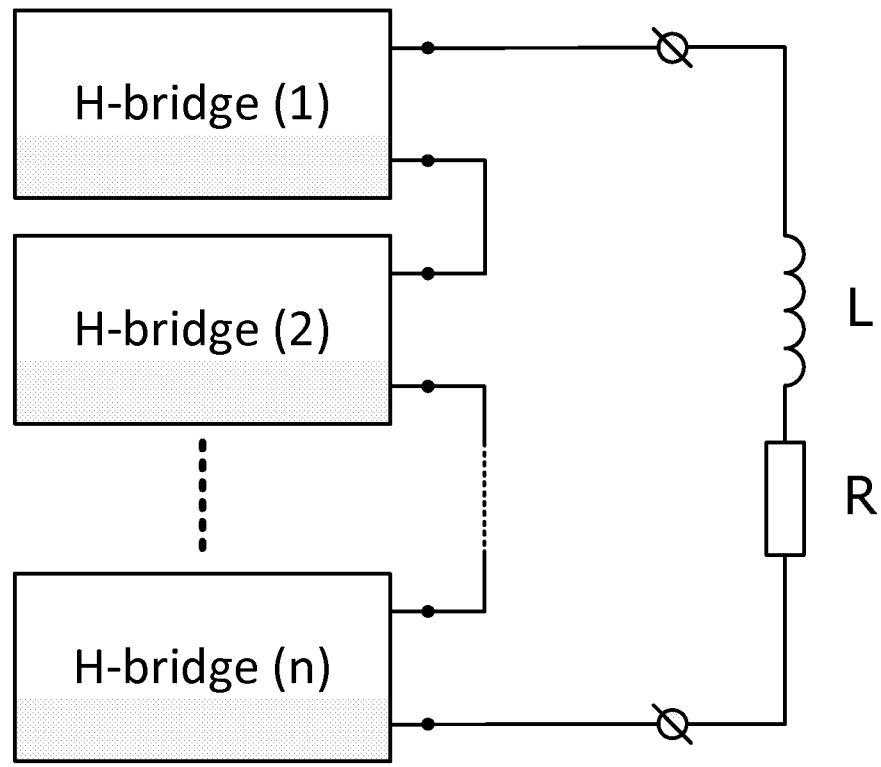
FIG. 2 shows a stacked H-bridge consists of multiple H-bridges placed in series according to the state of the art.

A single H-bridge with IGBT switches according to the state of the art is shown in FIG. 1, in principle any electronically controlled switch can be used instead. The switches are indicated with S1 to S4. The bridge is connected to an isolated voltage source indicated by UDC. The switches are controlled with a pulse width modulation scheme suitable for a H-bridge (for example unipolar or bipolar PWM). A stacked H-bridge consists of multiple H-bridges placed in series as shown in FIG. 2. The output connection terminals of the converter are indicated by a circle with a diagonal line through it, these output connections connect to the load represented by the series connection of "L" and "R".

Figure 3:
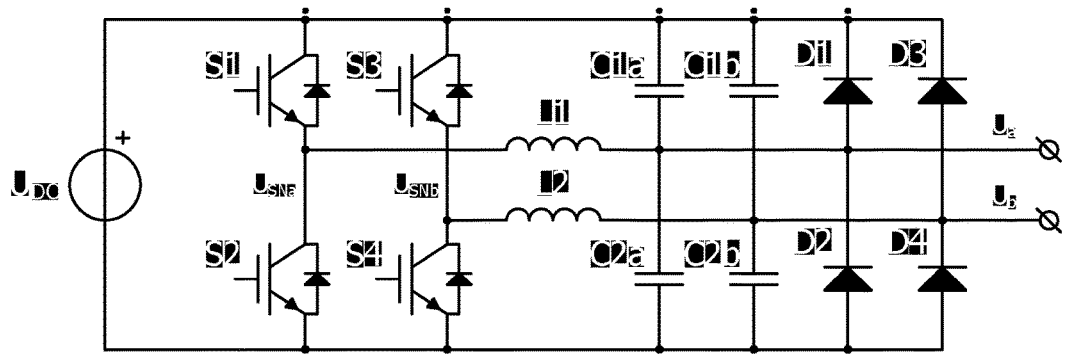
FIG. 3 shows a basic H-bridge cell including the dV/dt filter.

The proposed basic H-bridge cell including the dV/dt filter is shown in FIG. 3. The switches are drawn as IGBTs but might be replaced by other transistor or even with multiple transistors in parallel. The figure shows a switched power converter unit, comprising: a DC voltage source (UDC) with a positive output connection (+) and a negative output connection (−); two parallel branches between the positive and the negative output clamp of the DC voltage source, each branch comprising a series connection of two switching units S1, S2, S3, S4); a first output clamp (UA), coupled to a common point (SNA) of the two switching units (S1, S2) of the first parallel branch by means of a first inductive element (L1); coupled to the positive output clamp (+) of the DC voltage source (UDC) by diode (D1), the diode (D1) arranged such to allow current flow from the first output clamp (UA) to the DC voltage source (UDC); coupled to the negative output clamp (−) of the DC voltage source (UDC) by a diode (D2) arranged such to allow current flow from the DC voltage source (UDC) to the first output clamp (UA); a capacitor (C1a) coupled parallel to diode D1, and/or a capacitor (C2a) coupled parallel to diode D2; a second output clamp (UB), coupled to a common point (SNB) of the two switching units (S3, S4) of the second parallel branch by means of a second inductive element (L2); coupled to the positive output clamp (+) of the DC voltage source (UDC) a diode (D3) arranged such to allow current flow from the second output clamp (UB) to the DC voltage source (UDC); coupled to the negative output clamp (−) of the DC voltage source (UDC) by a diode (D4) arranged such to allow current flow from the DC voltage source to the second output clamp (UB); a capacitor (C1b) coupled parallel to diode D3, and/or a capacitor (C2b) coupled parallel to diode D4.

A dV/dt filter is thus placed on each of the two half-bridge legs. For half-bridge leg a (S1 & S2) this filter is composed of a filter inductor L1, filter capacitors C1a and C2a and clamping diodes D1 and D2. The two filter capacitors may also be replaced by a single filter capacitor with a capacitance of the sum of C1a and C2a. This single capacitor must be placed at the location of C1a or C2a. For the other half bridge (S3 & S4) the components at the corresponding positions have the same function.

The dV/dt filter is dimensioned such that the cut-off frequency of the filter (Fco), defined by Fco=1/(2*pi*sqrt(L1*(C1a+C2a))), is beyond the switching frequency of the corresponding half bridge leg.

Figure 4:
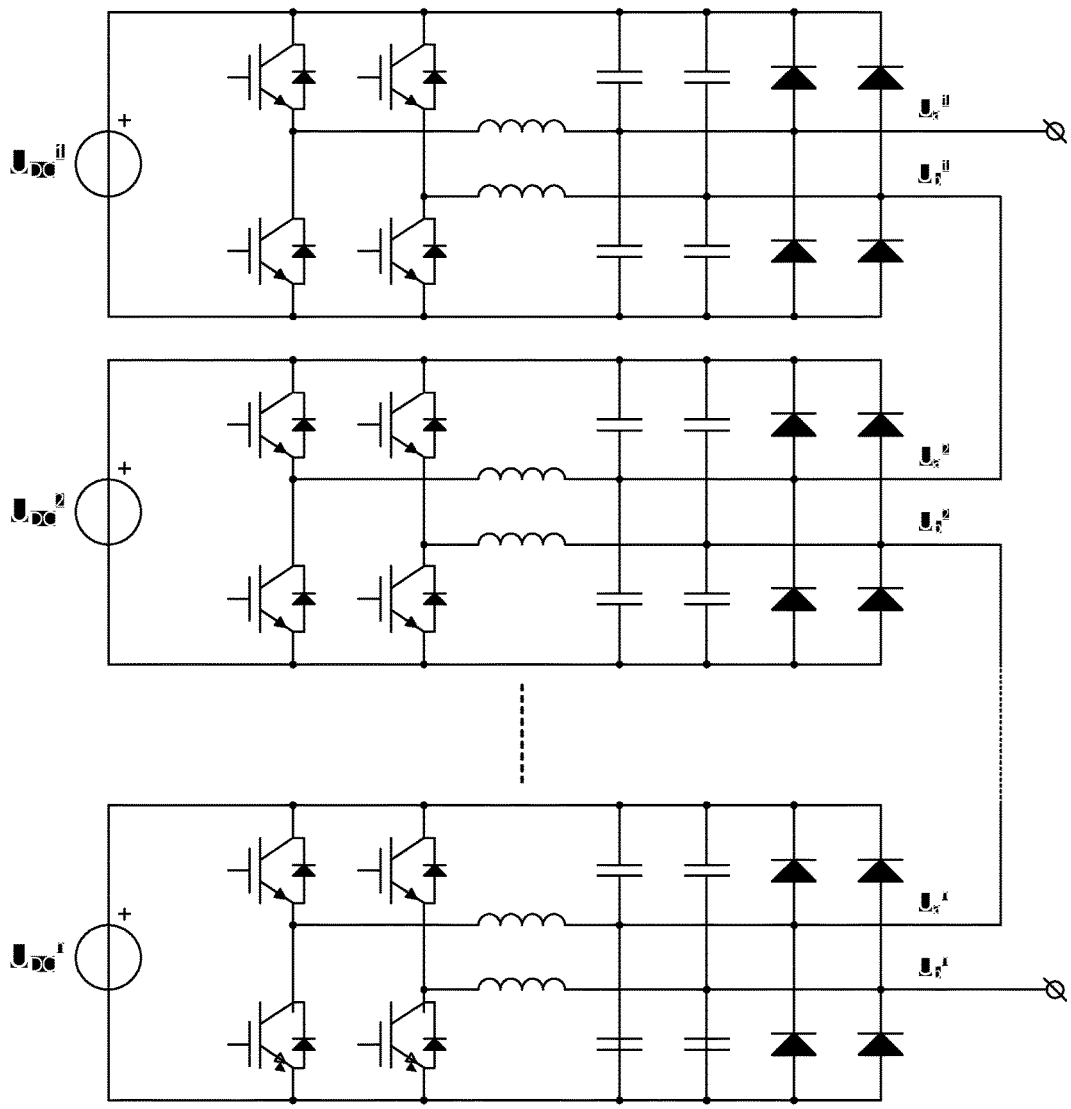
FIG. 4 shows a series connection of the filtered H-bridge cells from FIG. 3.

The series connection (stacking) of the filtered H-bridge cells is shown in FIG. 4, the drawing shows how an arbitrary number of H-bridge cells is connected in series. Any amount of H-bridge cells can be connected in series depending on the application.

Figure 5:
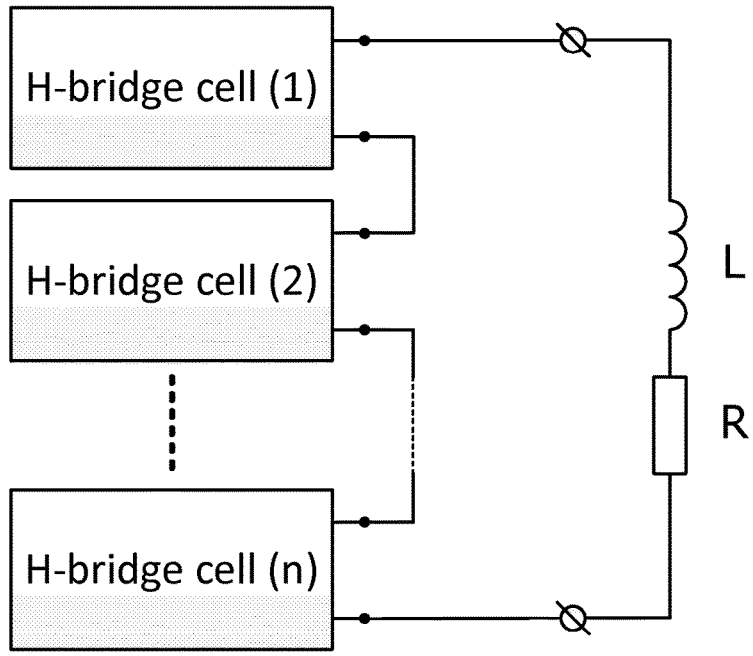
FIG. 5 shows a simplified drawing of the series connection of the H-bridge cells.

A simplified drawing of the series connection of the H-bridge cells, including the connection to the load (represented by "L" and "R"), is shown in FIG. 5.

Figure 6:
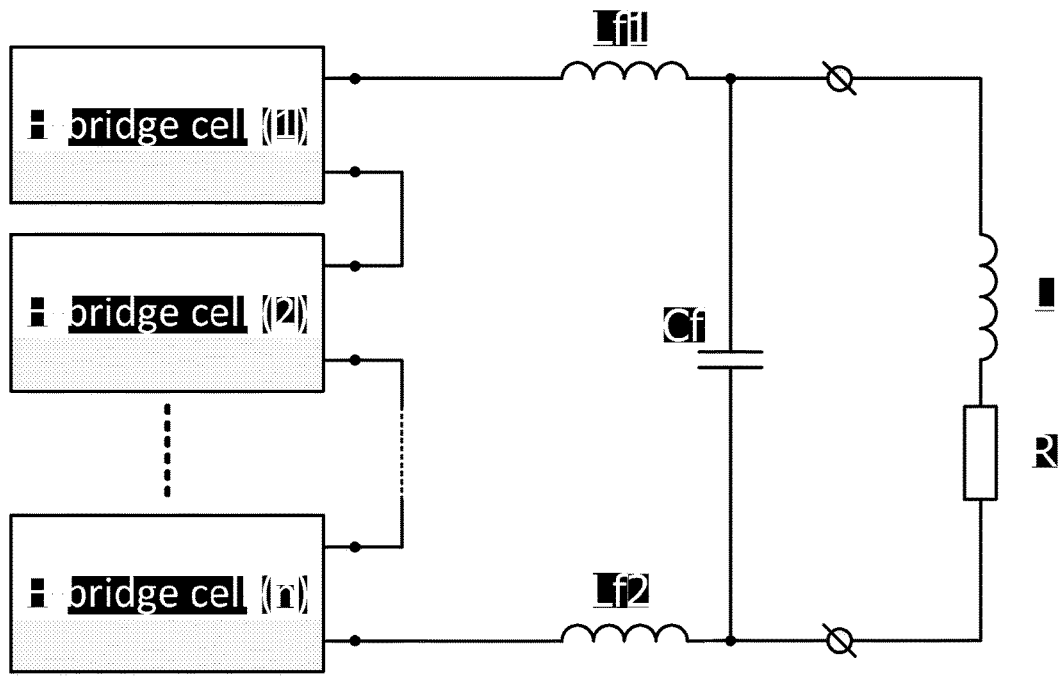
FIG. 6 shows an example with a symmetric LC filter.

Any type of output filtering can also be added to the complete power converter, an example with a symmetric LC filter is shown in FIG. 6.

Besides the embodiments shown, there are multiple variations possible, which are all believed to fall within the scope of the invention, as defined by the following claims.

The invention claimed is:

1. A switched power converter unit, comprising:
a DC voltage source (UDC) with a positive output connection (+) and a negative output connection (−);
two parallel branches between the positive and the negative output connection of the DC voltage source, each branch comprising a series connection of two switching units (S1, S2, S3, S4);
a first output clamp (UA), coupled to a common point (SNA) of the two switching units (S1, S2) of the first parallel branch by means of a first inductive element (L1);
coupled to the positive output clamp (+) of the DC voltage source (UDC) by diode (D1), the diode (D1) arranged such to allow current flow from the first output clamp (UA) to the DC voltage source (UDC);
coupled to the negative output clamp (−) of the DC voltage source (UDC) by a diode (D2) arranged such to allow current flow from the DC voltage source (UDC) to the first output clamp (UA);
a capacitor (C1a) coupled parallel to diode D1, and/or a capacitor (C2a) coupled parallel to diode D2;
a second output clamp (UB),
coupled to a common point (SNB) of the two switching units (S3, S4) of the second parallel branch by means of a second inductive element (L2);
coupled to the positive output clamp (+) of the DC voltage source (UDC) a diode (D3) arranged such to allow current flow from the second output clamp (UB) to the DC voltage source (UDC);
coupled to the negative output clamp (−) of the DC voltage source (UDC) by a diode (D4) arranged such to allow current flow from the DC voltage source to the second output clamp (UB);
a capacitor (C1b) coupled parallel to diode D3, and/or
a capacitor (C2b) coupled parallel to diode D4.

2. The switched power converter unit according to claim 1, wherein at least one switching unit is composed of multiple switching elements.

3. The switched power converter unit according to claim 1, wherein a cut-off frequency (Fco), defined by Fco=1/(2*pi*sqrt(L1*(C1a+C2a))), is above the switching frequency of the first parallel branch.

4. The switched power converter unit according to claim 1, wherein a cut-off frequency (Fco), defined by Fco=1/(2*pi*sqrt(L1*(C1b+C2b))), is above the switching frequency of the second parallel branch.

5. The switched power converter unit according to claim 1, wherein at least one of the diodes is connected is coupled in series to a resistive element.

6. The switched power converter unit of claim 1, comprising a plurality of switched power converter units according to any of the preceding claims, switched with their respective output clamps in series.

7. The switched power converter according to claim 6, wherein a load is coupled to the first output clamp (UA1) of the first switched power converter units of the plurality of switched power converter units by means of a first filter inductance (Lf1), and wherein said load is coupled to the second output clamp (UBn) of the nth switched power converter units of the plurality of switched power converter units by means of a second filter inductance (Lf1), and wherein a filter capacitance (Cf) is coupled in parallel to said load.

* * * * *